United States Patent
Choi et al.

(10) Patent No.: US 7,518,939 B2
(45) Date of Patent: Apr. 14, 2009

(54) PORTABLE DATA STORAGE APPARATUS

(75) Inventors: Jin-Hyeok Choi, Yongin-si (KR); Sam-Yong Bahng, Sungnam-si (KR); Chil-Hee Chung, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 11/762,537

(22) Filed: Jun. 13, 2007

(65) Prior Publication Data

US 2007/0236996 A1 Oct. 11, 2007

Related U.S. Application Data

(63) Continuation of application No. 11/484,532, filed on Jul. 11, 2006, which is a continuation-in-part of application No. 10/981,367, filed on Nov. 4, 2004, now Pat. No. 7,092,308.

(30) Foreign Application Priority Data

Jan. 13, 2004 (KR) ................................ 2004-02394

(51) Int. Cl.
*G11C 5/14* (2006.01)

(52) U.S. Cl. .................. 365/226; 365/149; 365/189.06; 365/189.07; 365/189.11; 365/189.09
(58) Field of Classification Search ................. 365/226, 365/149, 189.06, 189.07, 189.09, 189.11
See application file for complete search history.

(56) References Cited

U.S. PATENT DOCUMENTS

| | | | |
|---|---|---|---|
| 5,444,664 A * | 8/1995 | Kuroda et al. ................ 365/226 |
| 5,483,486 A | 1/1996 | Javanifard et al. |
| 6,052,313 A * | 4/2000 | Atsumi et al. ........... 365/189.05 |
| 6,414,862 B1 * | 7/2002 | Ogura .......................... 363/60 |
| 6,473,321 B2 * | 10/2002 | Kishimoto et al. ............. 363/59 |
| 6,683,809 B2 * | 1/2004 | Matsuda et al. ......... 365/185.18 |
| 2002/0001207 A1 * | 1/2002 | Kishimoto et al. ............. 363/59 |
| 2007/0230246 A1 * | 10/2007 | Umezawa et al. ....... 365/185.09 |

* cited by examiner

*Primary Examiner*—Tuan T. Nguyen
(74) *Attorney, Agent, or Firm*—F. Chau & Associates, LLC

(57) ABSTRACT

A memory card includes a non-volatile memory; and a power management unit for receiving an external supply voltage to supply an operating voltage to the non-volatile memory. The power management unit boosts/bypasses the external supply voltage based on whether the external supply voltage is lower than a detection voltage and then outputs the boosted/bypassed voltage as the operating voltage of the non-volatile memory.

11 Claims, 6 Drawing Sheets

PORTABLE DATA STORAGE APPARATUS

CROSS-REFERENCE TO RELATED APPLICATIONS

This application is a continuation of U.S. application Ser. No. 11/484,532 filed on Jul. 11, 2006, which is Continuation-In-Part of Ser. No. 10/981,367 filed Nov. 4, 2004 now U.S. Pat. No. 7,092,308 issued on Aug. 15, 2006, which claims priority to Korean Patent Application No. 2004-02394 filed on Jan. 13, 2004, the disclosures of which are all incorporated-by-reference herein in their entirety.

BACKGROUND

1. Technical Field

The present invention relates to a portable data storage apparatus, more particularly, a memory card that contains a non-volatile memory.

2. Discussion of Related Art

A smartcard—a type of memory card—is a card embedded with a memory in which data can be stored and retrieved. The smartcard receives its power from external sources like a card reader. Typically the memory inside this kind of memory card is a non-volatile memory such as EPROM, EEPROM or FLASH memory.

When connected with external sources like an electronic device, a memory card operates with a power supplied from the electronic device. When the power (hereinafter, referred to as an external supply voltage) supplied from the electronic device deviates from an operating voltage range of a non-volatile memory in the memory card, the non-volatile memory may not operate properly. For example, if the external supply voltage is lowered while writing/reading data in/from the non-volatile memory, erroneous data can be written/read in/from the non-volatile memory.

With conventional technology, lowering of an operating voltage of the non-volatile memory is limited due to a characteristic of the non-volatile memory that needs higher voltages than the external supply voltage. Furthermore, although an electronic device may operate with a low voltage (e.g. below 1.8V), it may be difficult to use a memory card having a non-volatile memory because non-volatile memories exhibit poor operating characteristics at low voltage. In other words, if a memory card having a non-volatile memory is applied to the low-voltage electronic device, the memory card may not operate reliably.

Therefore, a need exist for a power management system which can secure a stable operation of the non-volatile memory even when a memory card is supplied with an external supply voltage deviating from an operating voltage range of a non-volatile memory in the memory card.

SUMMARY OF THE INVENTION

In an exemplary embodiment of the present invention, a memory card comprises a non-volatile memory; and a power management unit for receiving an external supply voltage to supply an operating voltage to the non-volatile memory. The power management unit boosts/bypasses the external supply voltage based on whether the external supply voltage is lower than a detection voltage and then outputs the boosted/bypassed voltage as the operating voltage of the non-volatile memory.

In another exemplary embodiment of the present invention, a memory card comprises a printed circuit board; a passive capacitor installed at the printed circuit board; a non-volatile memory chip installed at the printed circuit board; and a controller circuit chip installed at the printed circuit board, for receiving an external supply voltage to supply an operating voltage to the non-volatile memory chip. The controller circuit chip performs a boosting operation using the passive capacitor when the external supply voltage is lower than a detection voltage, the boosted voltage being outputted as the operating voltage of the non-volatile memory chip. The controller circuit chip bypasses the external supply voltage as the operating voltage when the external supply voltage is the same as or higher than the detection voltage.

In still another exemplary embodiment of the present invention, a memory card comprises a non-volatile memory; and a power management unit for receiving an external supply voltage to supply an operating voltage to the non-volatile memory. The power management unit judges whether the external supply voltage belongs to a low voltage range or a high voltage range. When the external supply voltage belongs to the high voltage region, the power management unit bypasses the external supply voltage as the operating voltage. When the external supply voltage belongs to the low voltage region, the power management unit boosts the external supply voltage up to the operating voltage and outputs the boosted voltage as the operating voltage.

BRIEF DESCRIPTION OF THE DRAWINGS

The present invention will become more apparent by describing in detail exemplary embodiments thereof with reference to the attached drawings.

DESCRIPTION OF PREFERRED EMBODIMENTS

Figure 1:
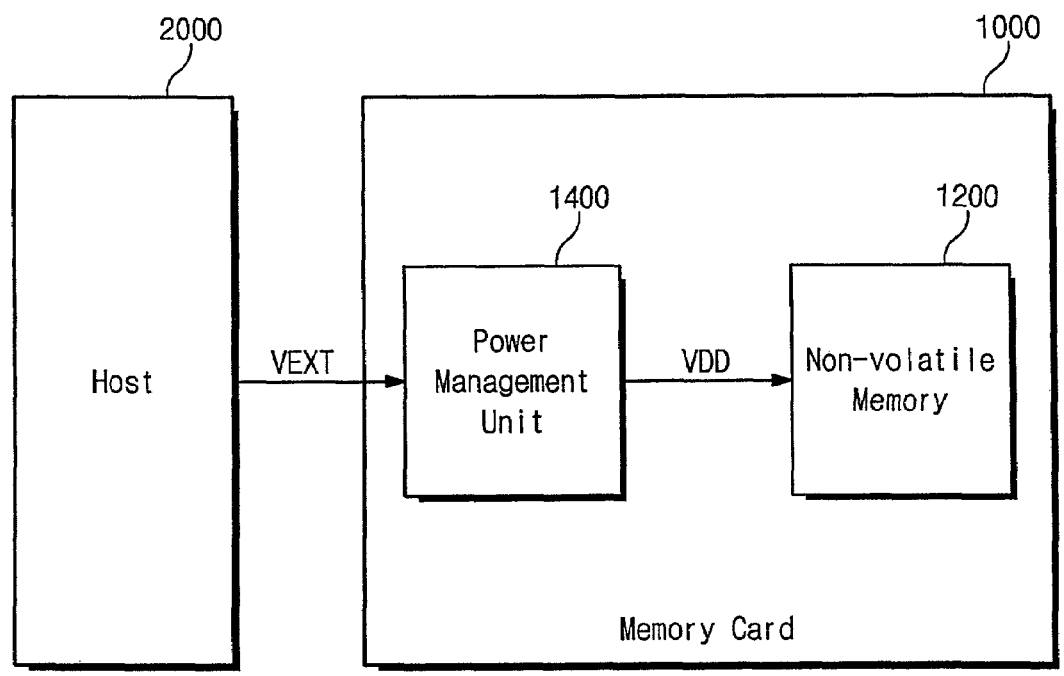
FIG. 1 is a schematic block diagram showing a memory card according to an exemplary embodiment of the present invention.

Referring to FIG. 1, a schematic block diagram showing a memory card according to an exemplary embodiment of the present invention is shown. A memory card 1000 includes a non-volatile memory 1200 and a power management unit (PMU) 1400. The non-volatile memory 1200 stores digital data information. The non-volatile memory 1200 may be a flash memory, a ferro-electric RAM (FRAM), a magnetoresistive RAM (MRAM), or a phase-change RAM (PRAM). The flash memory includes either a NAND-type memory or a NOR-type memory.

The power management unit 1400 receives an external supply voltage VEXT from a host 2000 and supplies an operating voltage VDD to the non-volatile memory 1200. The power management unit 1400 manages the operating voltage VDD of the non-volatile memory 1200 based on the external supply voltage VEXT and a detection voltage. In one exemplary embodiment, the detection voltage is set to be lower than the operating voltage VDD and higher than a minimum operating voltage of the non-volatile memory 1200. In another exemplary embodiment, the detection voltage is set to be the same as the minimum operating voltage of the non-volatile memory 1200. In still another exemplary embodiment, the detection voltage is set to be the same as the operating voltage VDD.

In exemplary embodiments of the present invention, the minimum operating voltage is the lowest voltage (e.g. 1.8V) of an operating range of the non-volatile memory 1200. A maximum operating voltage is the highest voltage (e.g. 2.4V) of the operating range of the non-volatile memory 1200. The operating voltage VDD is a voltage (e.g. 2.0V) between the minimum operating voltage and the maximum operating voltage.

When the external supply voltage VEXT is lower than the detection voltage, the power management unit 1400 boosts the external supply voltage up to a voltage lower than or the same as the operating voltage VDD and outputs the boosted voltage to the non-volatile memory 1200. When the external supply voltage VEXT is higher than the detection voltage and lower than the operating voltage VDD of the non-volatile memory 1200, the power management unit 1400 outputs the external supply voltage VEXT as the operating voltage VDD to the non-volatile memory 1200. When the external supply voltage VEXT is higher than the operating voltage VDD of the non-volatile memory 1200, the power management unit 1400 regulates (i.e., clamps) the external supply voltage VEXT and outputs the regulated voltage as the operating voltage VDD to the non-volatile memory 1200.

Thus, according to exemplary embodiments of the present invention, a stable operation of the non-volatile memory 1200 can be secured even when the external supply voltage VEXT is lower than the minimum operating voltage or the detection voltage. The low external supply voltage VEXT may be cause by, for example, a power consumption in the memory card.

Figure 2:
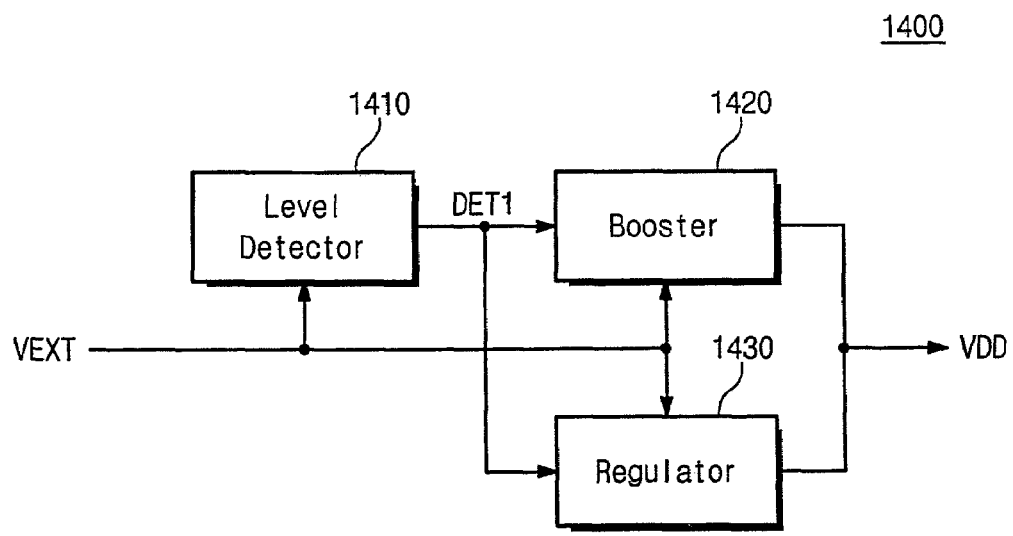
FIG. 2 is a schematic block diagram of a power management unit according to an exemplary embodiment of the present invention.

Referring to FIG. 2, a schematic block diagram showing a power management unit 1400 according to an exemplary embodiment of the present invention is shown. The power management unit 1400 includes a level detector circuit 1410, a booster circuit 1420, and a regulator circuit 1430. The power management unit 1400 operates with the external supply voltage VEXT supplied from the host 2000.

The level detector circuit 1410 determines whether the external supply voltage VEXT is lower than a detection voltage. As described above according to an exemplary embodiment of the present invention, the detection voltage is higher than a minimum operating voltage of the non-volatile memory 1200 and lower than an operating voltage thereof.

When the external supply voltage VEXT is lower than the detection voltage, the level detector circuit 1410 activates a detection signal DET1. When the external supply voltage VEXT is higher than the detection voltage, the level detector circuit 1410 inactivates a detection signal DET1. The booster circuit 1420 operates in response to activation of the detection signal DET1. The regulator circuit 1430 operates in response to inactivation of the detection signal DET1. That is, the booster circuit 1420 performs its boosting operation when the external supply voltage VEXT is lower than the detection voltage. The regulator circuit 1430 regulates the external supply voltage VEXT when the external supply voltage VEXT is higher than the detection voltage. The regulator circuit 1430 outputs an operating voltage VDD when the external supply voltage VEXT is higher than the detection voltage and lower than the operating voltage VDD of the non-volatile memory 1200. When the external supply voltage VEXT is higher than the operating voltage VDD of the non-volatile memory 1200, the regulator circuit 1430 makes the external supply voltage VEXT lowered to the operating voltage VDD.

The regulator circuit 1430 may output the operating voltage VDD when the external supply voltage VEXT is higher than the minimum operating voltage of the non-volatile memory 1200 and lower than the operating voltage VDD thereof. A reference voltage used in the regulator circuit 1430 is supplied from the level detector circuit 1410 or, alternatively, is generated in the regulator circuit 1430.

Figure 3:
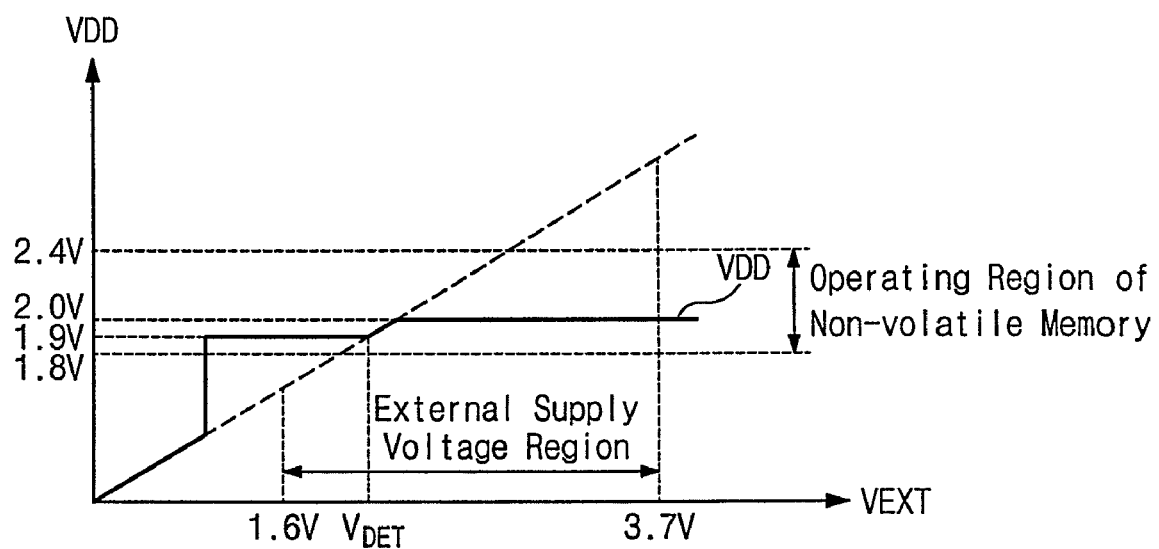
FIG. 3 is a graph showing an operating voltage generated in a power management unit according to an exemplary embodiment of the present invention.

Referring to FIG. 3, a diagram showing a graph of an operating voltage VDD generated in a power management unit 1400 according to an exemplary embodiment of the present invention is shown. The non-volatile memory 1200 operates in an operating range from 1.8V to 2.4V. An operating voltage VDD of the non-volatile memory 1200 is 2.0V. In conventional technology, if the external supply voltage VEXT is lower than a minimum operating voltage (e.g. 1.8V) of the non-volatile memory 1200, a stable operation of the non-volatile memory 1200 may not be secured. To prevent this, in conventional technology, the external supply voltage VEXT becomes at least the minimum operating voltage of the non-volatile memory 1200. However, the external supply voltage VEXT may not be avoided to become lower than the minimum operating voltage of the non-volatile memory 1200 due to a power consumption in the memory card.

A memory card, according to an exemplary embodiment of the present invention, may secure a stable operation of the non-volatile memory 1200 even when the external supply voltage VEXT becomes lower than the minimum operating voltage of the non-volatile memory 1200 or the detection voltage VDET.

When the external supply voltage VEXT is higher than the operating voltage VDD of the non-volatile memory 1200, the external supply voltage VEXT is regulated to the operating voltage VDD of the non-volatile memory 1200. When the external supply voltage VEXT is lower than the operating voltage VDD of the non-volatile memory 1200 and higher than the detection voltage VDET, a voltage following the external supply voltage VEXT becomes the operating voltage VDD of the non-volatile memory 1200. This process can be accomplished by the regulator circuit 1430 in FIG. 2. When the external supply voltage VEXT is lower than the detection voltage VDET, the external supply voltage VEXT is boosted up to the detection voltage VDET. The boosted voltage becomes the operating voltage VDD of the non-volatile memory 1200. This process can be accomplished by the booster circuit 1420 in FIG. 2.

Therefore, according to an exemplary embodiment of the present invention, even when the external supply voltage VEXT deviates from an operating region (range) of the non-volatile memory 1200, the non-volatile memory 1200 installed at the memory card can perform its stable operation.

Figure 4:
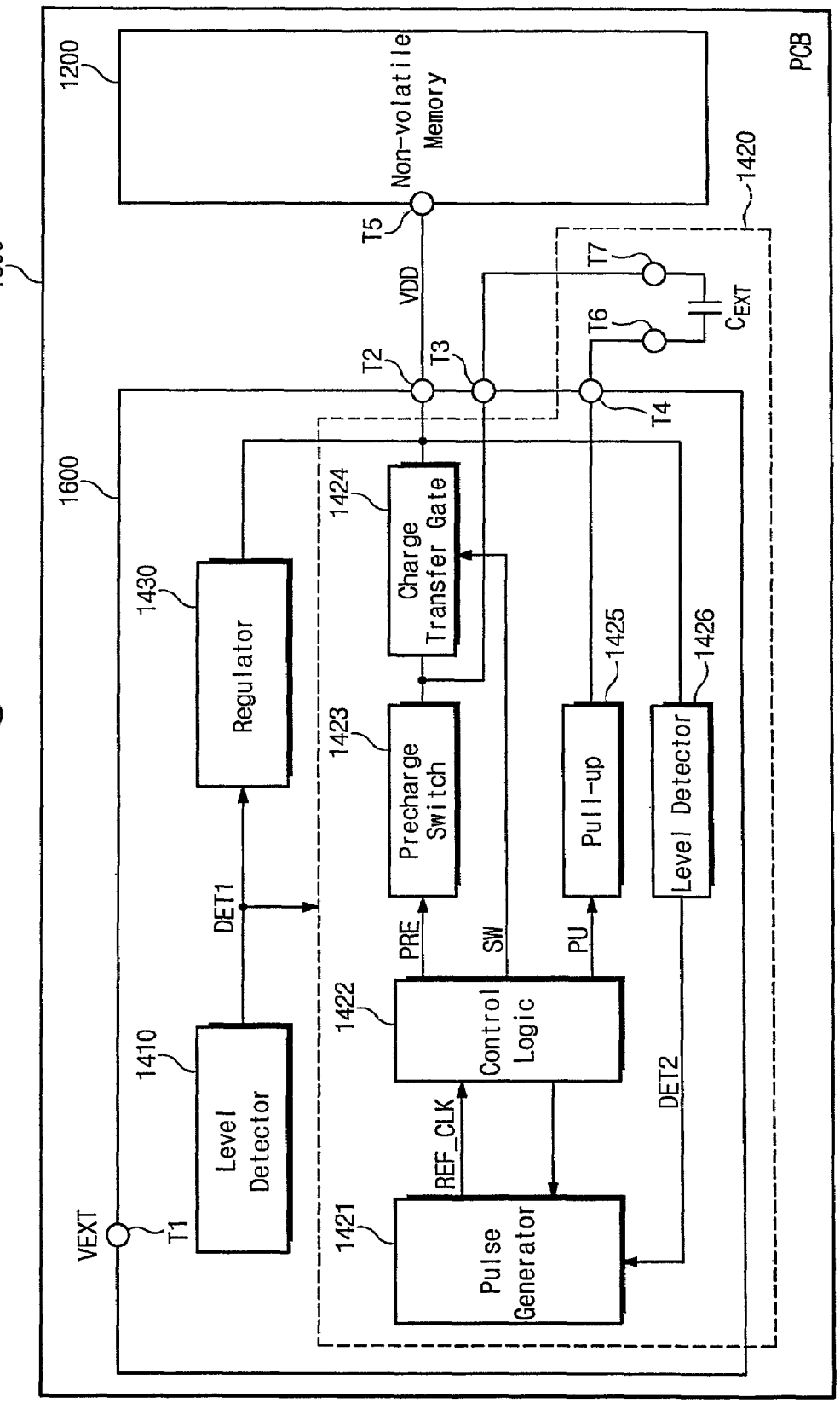
FIG. 4 is a schematic block diagram showing a memory card including a booster circuit according to an exemplary embodiment of the present invention.
Figure 5:
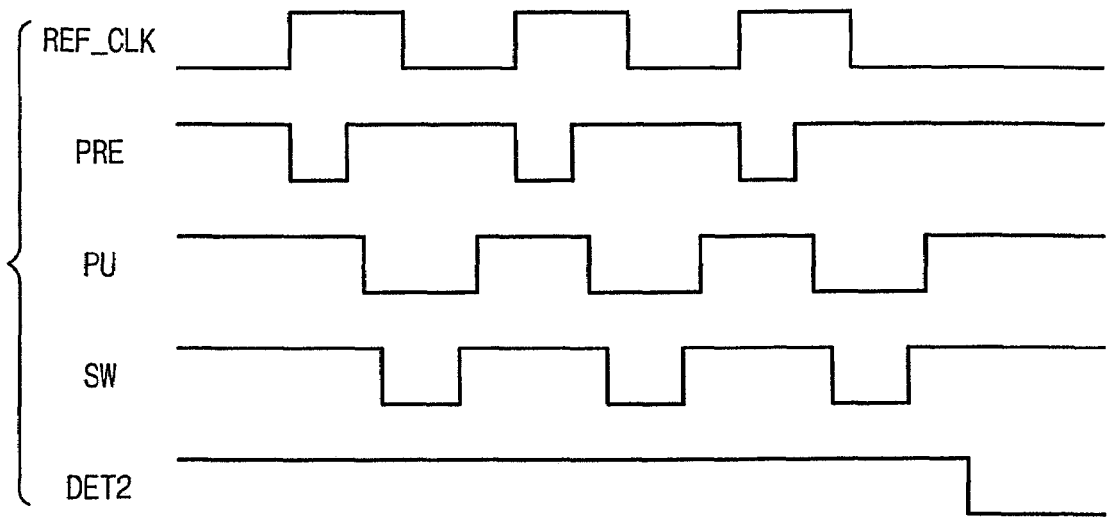
FIG. 5 shows clock signals for describing a boosting operation of a booster circuit in FIG. 4.

FIG. 4 is a schematic block diagram showing a memory card including a booster circuit according to an exemplary embodiment of the present invention. FIG. 5 shows clock signals for illustrating a boosting operation of a booster circuit in FIG. 4.

The power management unit 1400 includes a level detector circuit 1410, a booster circuit 1420 and a regulator circuit 1430. The power management unit 1400 may be integrated in a memory controller 1600 for controlling the non-volatile memory 1200. Preferably, the non-volatile memory 1200 and the memory controller 1600 may be installed at a printed circuit board (PCB). The memory controller 1600 may be supplied with the external supply voltage VEXT via a T1 terminal. The memory controller 1600 outputs an operating voltage VDD to T5 terminal of the non-volatile memory 1200 via T2 terminal. The level detector circuit 1410 and the regulator circuit 1430 are described in FIG. 2.

The booster circuit 1420 according to an exemplary embodiment of the present invention includes a pulse generator 1421, control logic 1422, a pre-charge switch 1423, a charge transfer gate 1424, a pull-up switch 1425, a level detector 1426, and a boosting capacitor CEXT as a passive capacitor. As shown in FIG. 4, the boosting capacitor CEXT of the booster circuit 1420 may be installed outside of the memory controller 1600, i.e., on the printed circuit board 1800. Terminals T6 and T7 of the boosting capacitor CEXT are electrically connected to terminals T3 and T4 of the memory controller 1600. In another exemplary embodiment of the present invention, the boosting capacitor CEXT may be integrated in the memory controller 1600. The boosting capacitor CEXT may be made simultaneously with the printed circuit board 1800. Alternatively, the boosting capacitor CEXT may be installed at the printed circuit board 1800 after the printed circuit board 1800 is made.

The booster circuit 1420 operates when the detection signal DET1 from the level detector circuit 1410 is activated. The level detector 1426 of the booster circuit 1420 is connected to an output of the charge transfer gate 1424. The level detector 1426 determines whether the operating voltage VDD supplied to the non-volatile memory 1200 is lower than a detection voltage. When the external supply voltage VEXT is lower than the detection voltage VDET, the level detector 1426 activates a detection signal DET2. If the external supply voltage VEXT is higher than the detection voltage VDET, the level detector 1426 inactivates the detection signal DET2. The pulse generator 1421 generates a reference clock signal REF_CLK having a certain period in response to activation of the detection signal DET2. When the detection signal DET2 is inactivated, the pulse generator 1421 stops generating the reference clock signal REF_CLK. A detection level of the pulse generator 1421 may be same the as or different from a detection level of the level detector circuit 1410.

Referring to FIG. 5, the control logic 1422 generates control signals such as PRE, SW and PU according to a certain timing in response to the reference clock signal REF_CLK. For example, the control logic 1422 activates the pre-charge control signal PRE during a certain time when the reference clock signal REF_CLK changes from a low level to a high level. The pre-charge switch 1423 charges an input of the charge transfer gate 1424 (i.e. one terminal of the boosting capacitor CEXT) in response to activation of the pre-charge control signal PRE.

After inactivation of the pre-charge control signal PRE, the control logic 1422 activates the pull-up control signal PU. The pull-up switch 1425 drives the terminal T6 of the boosting capacitor CEXT with the external supply voltage VEXT in response to activation of the pull-up control signal PU. This process forces a pre-charged voltage of the T7 terminal of the boosting capacitor CEXT to be boosted up to twice the external supply voltage VEXT.

After inactivation of the pull-up control signal PU, the control logic 1422 activates the switch control signal SW during a certain time. When the switch control signal SW is activated, the charge transfer gate 1424 transfers a voltage (or charges) at the T3 terminal boosted via the boosting capacitor CEXT to the T2 terminal. The operating voltage VDD may increase up to a certain voltage by the above boosting operation that can be performed in every cycle (or period) of the reference clock signal REF_CLK. When the operating voltage VDD increases up to the certain voltage, the level detector 1426 inactivates the detection signal DET2. In other words, the pulse generator 1421 stops generating the reference clock signal REF_CLK. That is, a boosting operation of the boosting circuit 1420 stops.

In an exemplary embodiment, the pre-charge switch 1423 and the charge transfer gate 1424 may be a PMOS transistor. The pull-up switch 1425 may be an inverter.

When the external supply voltage VEXT is lower than a detection voltage the booster circuit 1420 of the power management unit 1400 boosts the external supply voltage VEXT and outputs the boosted voltage as the operating voltage VDD to the non-volatile memory 1200. In an exemplary embodiment of the present invention, the detection voltage is set to be higher than the minimum operating voltage of the non-volatile memory and lower than its operating voltage. When the external supply voltage VEXT is higher than the detection voltage and lower than the operating voltage VDD of the non-volatile memory 1200, the regulator circuit 1430 of the power management unit 1400 outputs the external supply voltage VEXT as the operating voltage VDD to the non-volatile memory 1200. When the external supply voltage VEXT is higher than the operating voltage VDD of the non-volatile memory 1200, the regulator circuit 1430 of the power management unit 1400 regulates the external supply voltage VEXT and outputs the regulated voltage as the operating voltage VDD to the non-volatile memory 1200.

Accordingly, although the external supply voltage VEXT becomes lower than the detection voltage or the minimum operating voltage of the non-volatile memory 1200 due to, for example, a power consumption in the memory card, a stable operation of the non-volatile memory 1200 can be secured by the power management unit 1400.

In particular, the boosting of the external supply voltage VEXT is determined according to whether the external supply voltage VEXT is lower than the detection voltage. The detection voltage may be set to be higher than the minimum operating voltage of the non-volatile memory and lower than its operating voltage. Alternatively, the detection voltage of the level detector circuit 1410 may be set to be the minimum operating voltage of the non-volatile memory 1200.

Figure 6:
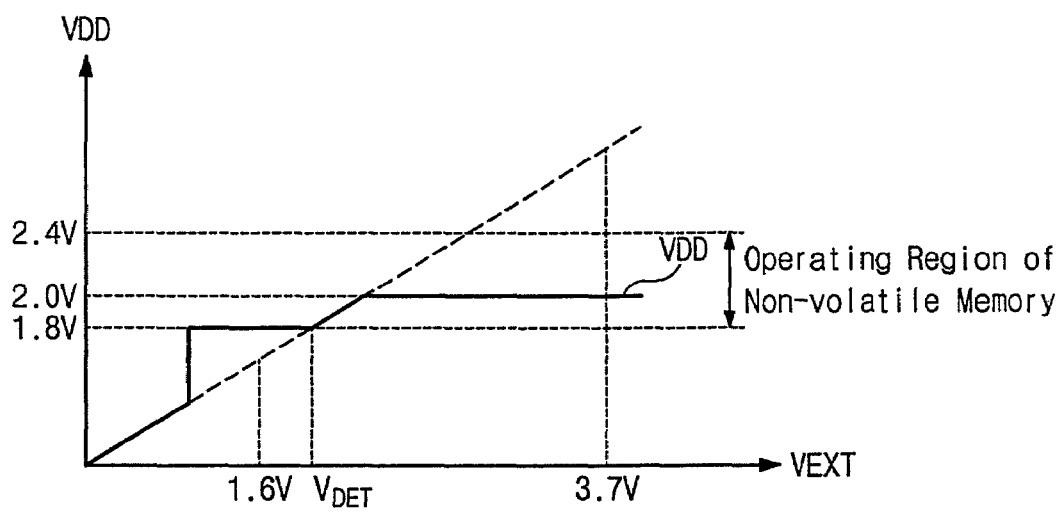
FIGS. 6 and 7 are graphs showing an operating voltage supplied to a non-volatile memory in a memory card according to an exemplary embodiment of the present invention.

A graph of the operating voltage VDD supplied to the non-volatile memory 1200 according to an exemplary embodiment of the present invention is shown in FIG. 6. FIGS. 3 and 6 show examples where the external supply voltage VEXT is boosted up to the detection voltage.

Figure 7:
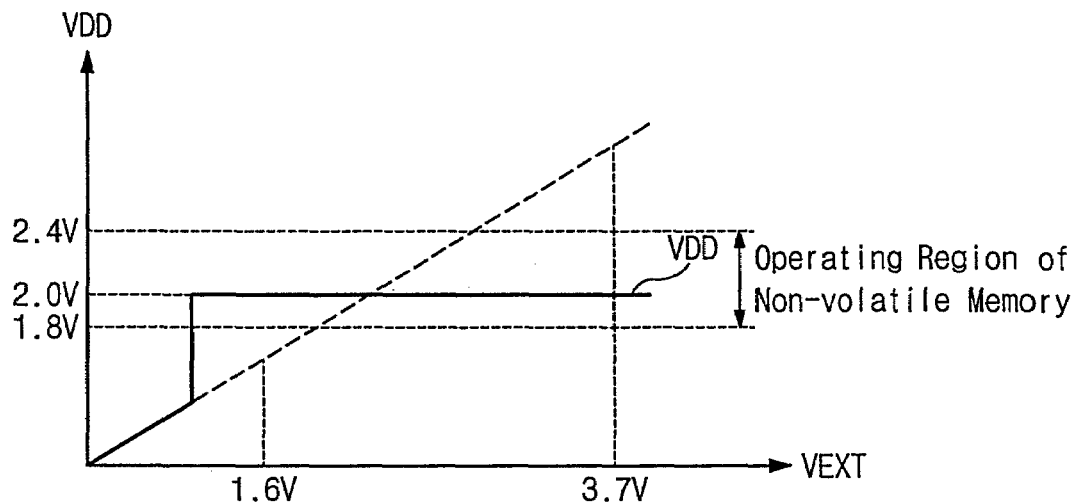

Referring to FIG. 7, the power management unit 1400 may boost the external supply voltage VEXT up to the operating voltage VDD. A graph of the operating voltage VDD supplied to the non-volatile memory 1200 according to another exemplary embodiment of the present invention is shown. When the external supply voltage VEXT is lower than the operating voltage VDD of the non-volatile memory 1200, the booster circuit 1420 of the power management unit 1400 boosts the external supply voltage VEXT and outputs the boosted voltage as the operating voltage VDD to the non-volatile memory 1200. When the external supply voltage VEXT is higher than the operating voltage VDD of the non-volatile memory 1200, the regulator circuit 1430 of the power management unit 1400 regulates the external supply voltage VEXT to the operating voltage VDD and outputs the regulated voltage as the operating voltage VDD to the non-volatile memory 1200.

Figure 8:
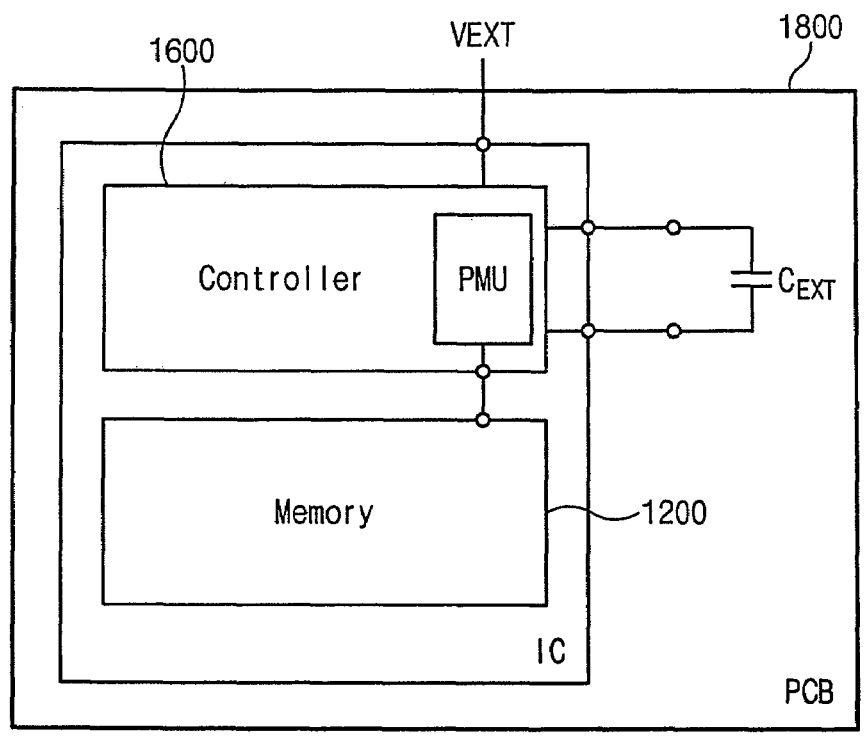
FIG. 8 is a schematic block diagram showing a memory card according to another exemplary embodiment of the present invention.

The memory controller 1600 and the non-volatile memory 1200 according to an exemplary embodiment of the present invention may be individual chips. The boosting capacitor CEXT in the booster circuit 1420 may be formed/integrated outside of the memory controller 1600, i.e., on the printed circuit board 1800. Remaining elements except for the boosting capacitor CEXT may be integrated in the memory controller 1600. In another exemplary embodiment of the present invention, as described in FIG. 8, the memory controller 1600 and the non-volatile memory 1200 can be formed in a single integrated circuit chip. In FIG. 8, the boosting capacitor CEXT is formed at the printed circuit board 1800, i.e., outside of the integrated circuit chip IC including the memory controller 1600 and the non-volatile memory 1200. Remaining elements of the power management unit PMU may be integrated in the integrated circuit chip IC.

A power management unit of a memory card according to one embodiment is designed under the assumption that a non-volatile memory operates at a low voltage. In a case where a non-volatile memory in a memory card operates at a low voltage, for example, an external device (e.g., a host) may supply a voltage between 1.65V and 1.95V to the memory card including the low-voltage non-volatile memory. On the other hand, a non-volatile memory operating at a high voltage can be comprised in a memory card. In this case, for example, an external device (e.g., a host) may supply a voltage between 2.7V and 3.6V to the memory card including the high-voltage non-volatile memory. Although a voltage between 2.7V and 3.6V is supplied to the memory card from the external device, a power management unit in FIG. 2 can't generate an operating voltage of the high-voltage non-volatile memory. This is because the supplied voltage to the memory card is regulated (or clamped) by a regulator to the operating voltage of the low-voltage non-volatile memory. In other words, in a case where an external host supplies a voltage between 1.65V and 1.95V to a memory card, the power-management unit in FIG. 2 can't generate an operating voltage of the high-voltage non-volatile memory. Further, in a case where the external host supplies a voltage between 2.7V and 3.6V to the memory card, the power management unit in FIG. 2 can't generate the operating voltage of the high-voltage non-volatile memory. Accordingly, although the external host supplies a low voltage or a high voltage to a memory card, a stable operation of the high-voltage non-volatile must be secured. For this, a power management unit according to another embodiment of the present invention is illustrated in FIG. 9.

Figure 9:
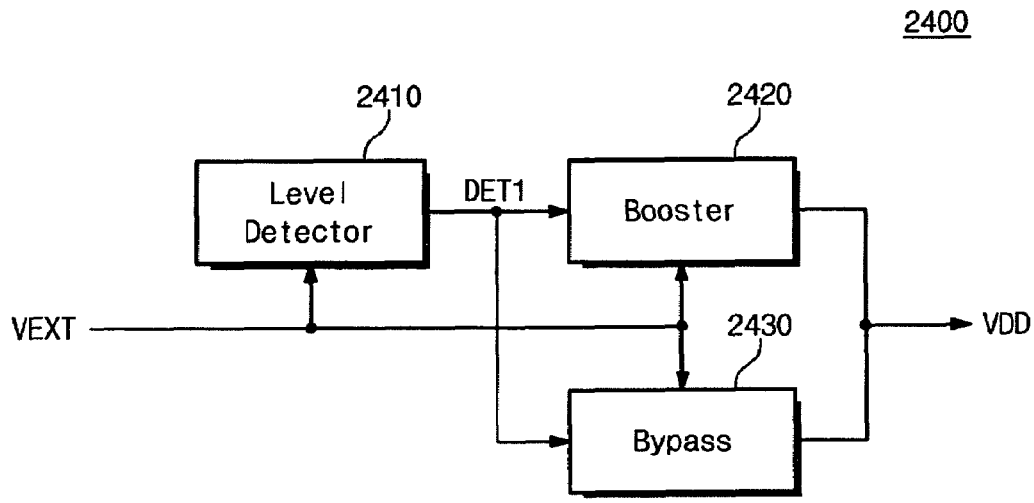
FIG. 9 is a schematic block diagram of a power management unit according to another exemplary embodiment of the present invention.

Referring to FIG. 9, the present power management unit 2400 includes a level detector circuit 2410, a booster circuit 2420, and a bypass circuit 2430, which operate at an external supply voltage VEXT.

The level detector circuit 2410 detects whether the external supply voltage VEXT is lower than a given detection voltage. In this embodiment, the detection voltage may be set to a voltage between a low voltage range (e.g., 1.65V to 1.96V) and a high voltage range (e.g., 2.7V to 3.6V). When the external supply voltage VEXT is lower than the detection voltage, the level detector circuit 2410 activates a detection signal DET1. When the external supply voltage VEXT is the same as or higher than the detection voltage, the level detector circuit 2410 inactivates the detection signal DET1. The booster circuit 2420 operates when the detection signal DET1 is activated, and the bypass circuit 2430 operates when the detection signal DET1 is inactivated. That is, the booster circuit 2420 performs a boosting operation when the external supply voltage VEXT is lower than the detection voltage. The bypass circuit 2430 bypasses the external supply voltage VEXT when the external supply voltage VEXT is the same as or higher than the detection voltage. In other words, when the external supply voltage VEXT is the same as or higher than the detection voltage, as an operating voltage of a non-volatile memory, an output voltage of the bypass circuit 2430 follows the external supply voltage VEXT.

In exemplary embodiments, when the external supply voltage VEXT is lower than the detection voltage, the booster circuit 2420 of the power management unit 2400 boosts the external supply voltage VEXT and supplies the boosted voltage to the non-volatile memory as its operating voltage. When the external supply voltage VEXT is the same as or higher than the detection voltage, the bypass circuit 2430 of the power management unit 2400 supplies to the non-volatile memory an operating voltage of the non-volatile memory that follows the external supply voltage VEXT.

In some embodiments, the booster circuit 2420 and the bypass circuit 2430 constitute a voltage converter circuit that boosts or bypasses the external supply voltage VEXT based on a detection result of the level detector circuit 2410. The bypass circuit 2430, for example, may consist of a PMOS transistor, and the booster circuit 2420 may be configured sufficiently the same as that illustrated in FIG. 4. In this case, as described above, a detection voltage of the level detector circuit 2410 in FIG. 9 may be set differently from that described in FIG. 4. In other words, the detection voltage of the level detector circuit 2410 in FIG. 9 may be set to a voltage suitable for determining whether the external supply voltage VEXT belongs to either a low voltage range or a high voltage range.

Figure 10:
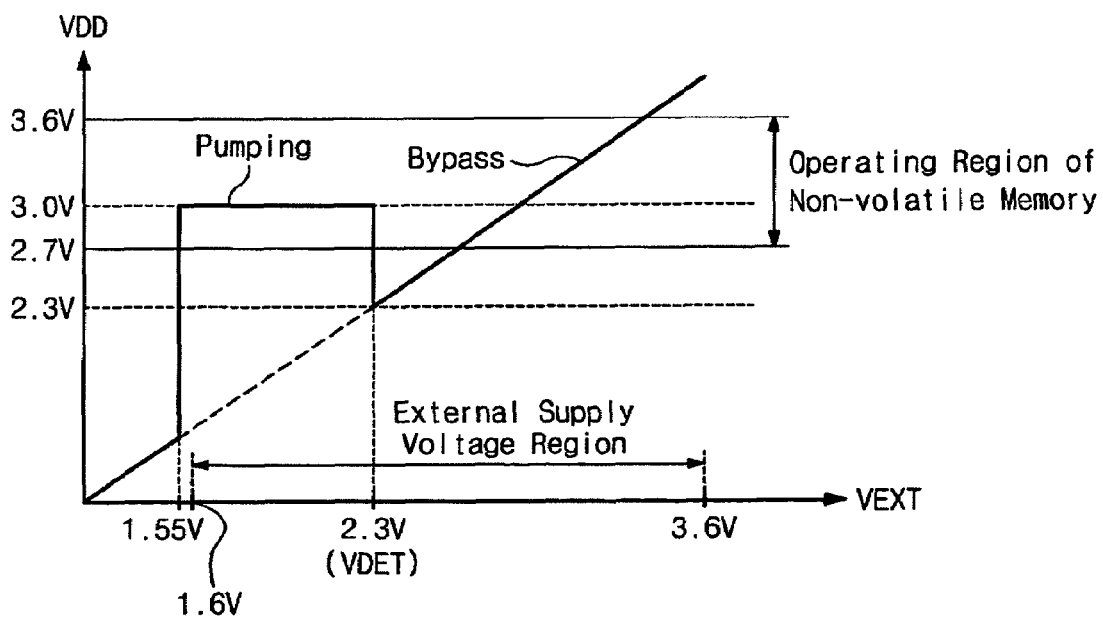
FIG. 10 is a graph showing an operating voltage generated in a power management unit in FIG. 9.

FIG. 10 is a waveform diagram showing an operating voltage generated from a power management unit in FIG. 9.

It is assumed that a memory card according to another embodiment of the present invention includes a non-volatile memory operating at a voltage between 2.7V to 3.6V. According to this assumption, when an external host supplies an external supply voltage VEXT lower than a detection voltage (e.g. 2.3V) DET to a memory card, a level detector circuit 2410 in FIG. 9 activates a detection signal DET1. A booster circuit 2420 performs the above-described boosting operation in response to an activation of the detection signal DET1, and then supplies a boosted voltage to a non-volatile memory in the memory card as an operating voltage VDD. At the same time, a bypass circuit 2430 may be inactivated by the activation of the detection signal DET1. Although a low voltage is supplied to the memory card from the external host, the booster circuit 2420 may generate an operating voltage sufficient to secure a stable operation of the high-voltage non-volatile memory in the memory card.

On the other hand, when the external host supplies to the memory card the external supply voltage VEXT that is the same as or higher than the detection voltage (e.g. 2.3V) DET, the level detector circuit 2410 in FIG. 9 inactivates the detection signal DET1. The bypass circuit 2430 bypasses the external supply voltage in response to an inactivation of the detection signal DET1. As illustrated in FIG. 10, this means that an operating voltage VDD to the high-voltage non-volatile memory follows the external supply voltage VEXT. At the same time, the booster circuit 2420 is inactivated as the detection signal DET1 is inactivated. That is, when the detection signal DET1 is inactivated, no boosting operation of the booster circuit 2420 is carried out.

Although exemplary embodiments have been described herein with reference to the accompanying drawings, it is to be understood that he present invention is not limited to those precise embodiments, and that various other changes and modifications may be affected therein by one ordinary skill in the related art without departing from the scope of spirit of the invention.

What is claimed is:

1. A method of supplying an operating voltage to a non-volatile memory in a memory card, comprising:
   receiving an external supply voltage;
   boosting the external supply voltage when the external supply voltage is lower than a detection voltage, the boosted voltage being supplied to the non-volatile memory as the operating voltage; and
   bypassing the external supply voltage when the external supply voltage is the same as or higher than the detection voltage, the bypassed voltage being supplied to the non-volatile memory as the operating voltage.

2. The method of claim 1, wherein the detection voltage is higher than a minimum operating voltage of an operating voltage range of the non-volatile memory and lower than the operating voltage.

3. The method of claim 1, wherein the detection voltage is a minimum operating voltage of an operating range of the non-volatile memory.

4. The method of claim 3, wherein when the external supply voltage is higher than the operating voltage, the external supply voltage is regulated up to the operating voltage.

5. The method of claim 1, wherein the detection voltage is a voltage between a low voltage range and a high voltage range.

6. A method of supplying an operating voltage to a non-volatile memory in a memory card, comprising:
   receiving an external supply voltage;
   boosting the external supply voltage when the external supply voltage belongs to a low voltage range of the non-volatile memory, the boosted voltage being supplied to the non-volatile memory as the operating voltage; and
   bypassing the external supply voltage when the external supply voltage belongs to a high voltage range, the bypassed voltage being supplied to the non-volatile memory as the operating voltage.

7. The method of claim 6, wherein when the external supply voltage belongs to the low voltage range, the external supply voltage is boosted up to the operating voltage.

8. The method of claim 6, wherein whether the external supply voltage belongs to a low voltage range or a high voltage range of the non-volatile memory, is determined according to whether the external supply voltage is lower or higher than a detection voltage.

9. A method of supplying an operating voltage to a non-volatile memory in a memory card, comprising:
   receiving an external supply voltage;
   determining whether the external supply voltage is lower than a detection voltage;
   converting the external supply voltage to the operating voltage in a boosting manner when the external supply voltage is lower than the detection voltage; and
   converting the external supply voltage to the operating voltage in a bypassing manner when the external supply voltage is the same as or higher than the detection voltage.

10. The method of claim 9, wherein the detection voltage is a voltage between a low voltage range and a high voltage range.

11. A method of supplying an operating voltage to a non-volatile memory in a memory card, comprising:
    receiving an external supply voltage;
    determining whether the external supply voltage is lower than a detection voltage; and
    converting the external supply voltage to the operating voltage in a boosting manner when the external supply voltage is lower than the detection voltage; and
    converting the external supply voltage to the operating voltage in a regulating manner when the external supply voltage is higher than the detection voltage and lower than the operating voltage.

* * * * *